United States Patent
Pfau

(10) Patent No.: US 11,115,250 B1
(45) Date of Patent: Sep. 7, 2021

(54) MPPM ENCODER AND DECODER

(71) Applicant: Acacia Communications, Inc., Maynard, MA (US)

(72) Inventor: Timo Pfau, Somerville, MA (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 16/804,140

(22) Filed: Feb. 28, 2020

Related U.S. Application Data

(60) Provisional application No. 62/812,332, filed on Mar. 1, 2019.

(51) Int. Cl.
 *H04L 25/49* (2006.01)
 *H04B 10/516* (2013.01)
 *H04B 10/524* (2013.01)

(52) U.S. Cl.
 CPC ..... *H04L 25/4902* (2013.01); *H04B 10/5161* (2013.01); *H04B 10/524* (2013.01)

(58) Field of Classification Search
 CPC ........ H03M 13/09; H03M 13/05; H03M 7/00; H03M 7/3006; H04L 1/0009; H04L 1/0075
 See application file for complete search history.

(56) References Cited

U.S. PATENT DOCUMENTS

| | | | | |
|---|---|---|---|---|
| 3,781,881 A | * | 12/1973 | Hovey | G01S 13/78 342/45 |
| 4,573,034 A | * | 2/1986 | Schouhamer Immink | H04L 25/4906 341/95 |
| 4,620,311 A | * | 10/1986 | Schouhamer Immink | G11B 20/1426 375/292 |
| 2010/0085219 A1 | * | 4/2010 | Monro | H03M 7/30 341/60 |
| 2015/0318865 A1 | * | 11/2015 | Rotge | H03M 7/30 708/520 |
| 2016/0164539 A1 | * | 6/2016 | Masleid | G06F 11/1625 714/757 |

OTHER PUBLICATIONS

Indrani Ray, "Analysis of Offset Pulse Position Modulation", Doctoral Thesis, University of Huddersfield. (Year: 2015).*

Hisayoshi Sugiyama and Kiyoshi Nosu, "MPPM: A Method for Improving the Band-Utilization Efficiency in Optical PPM", Journal of Lightwave Technology, vol. 7, No. 3, Mar. 1989. (Year: 1989).*

* cited by examiner

*Primary Examiner* — Khanh C Tran
(74) *Attorney, Agent, or Firm* — Joseph D'Angelo

(57) ABSTRACT

A method, system, and apparatus for calculating coefficients for inputs and corresponding output sequences for a pulse-position modulation encoder using a stored structure; wherein the structure is a subset of the values of Pascal's Triangle.

20 Claims, 12 Drawing Sheets

$$\binom{n}{k} = \binom{n-1}{k} + \binom{n-1}{k-1}$$

110 — # of possible combinations in an (n,k) MPPM block

120 — # of remaining possible combinations if first slot contains no pulse.

130 — # of remaining possible combinations if first slot contains a pulse.

Figure 1

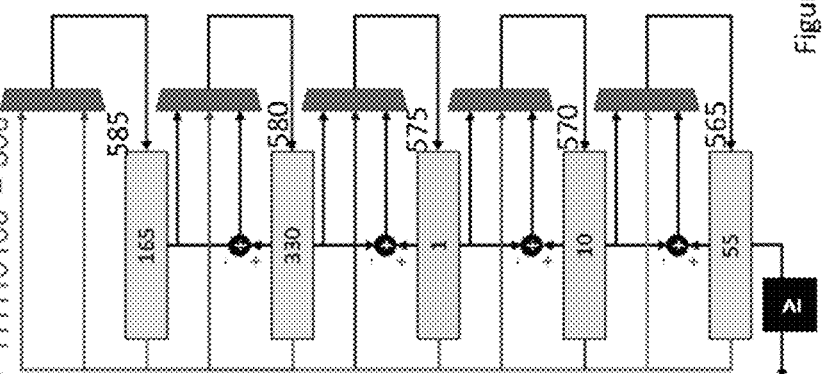
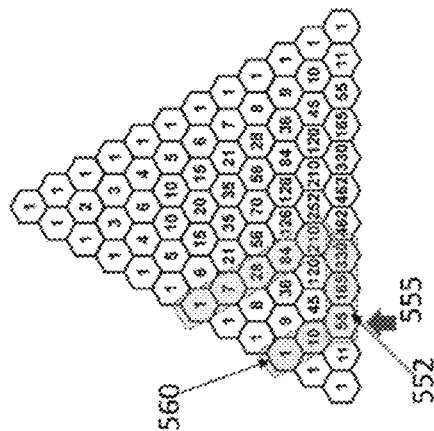
Figure 5b
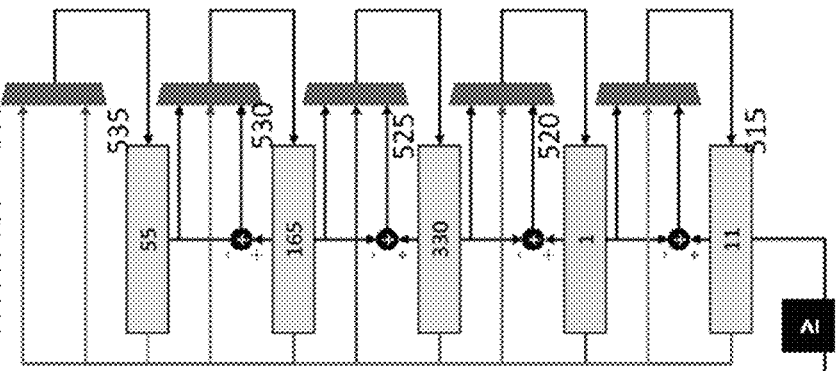
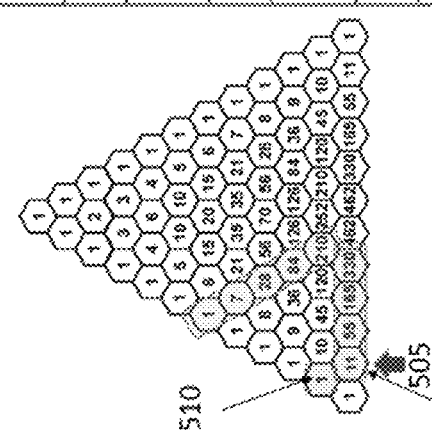
Figure 5a

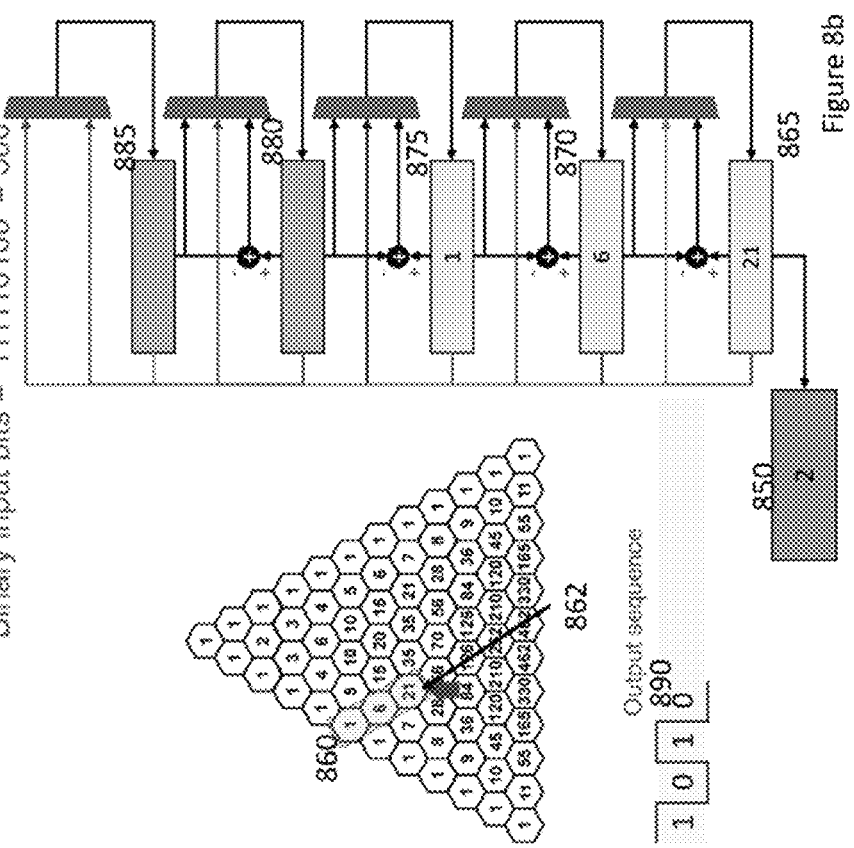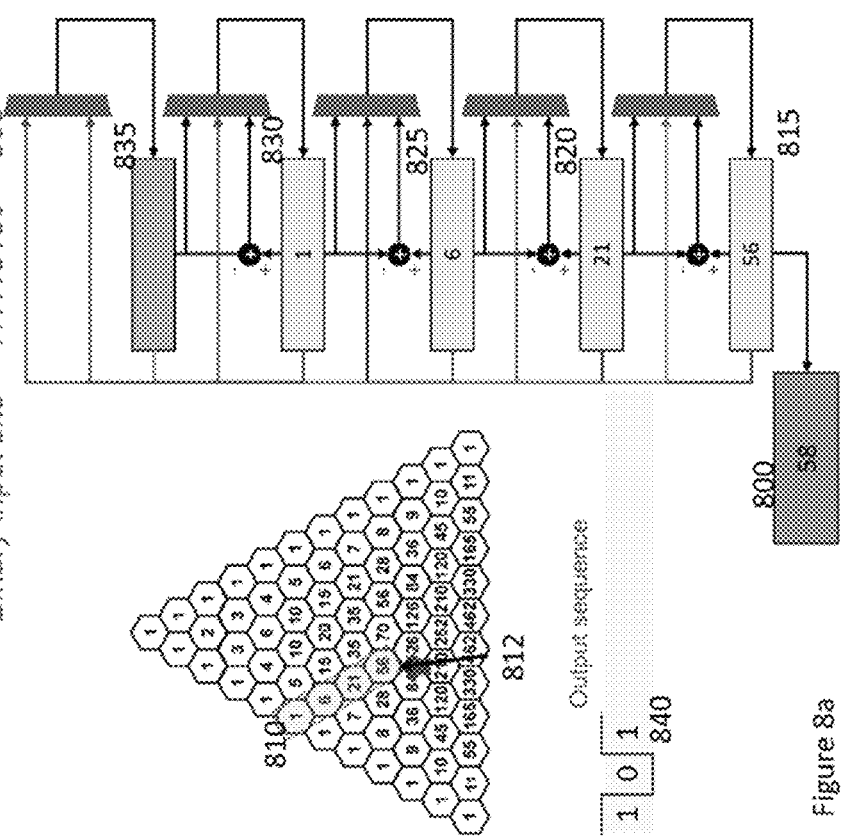
Figure 8a
Figure 8b

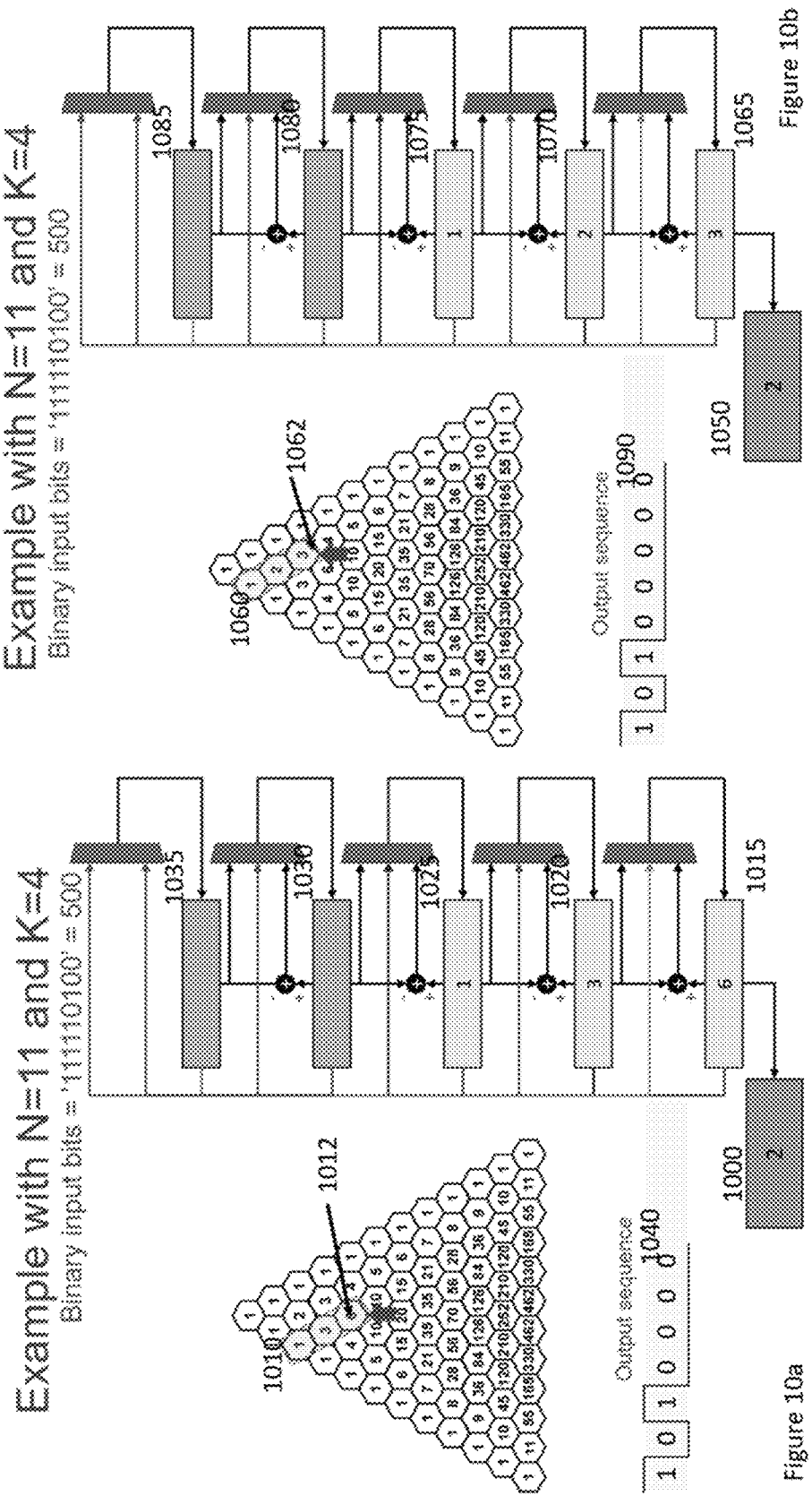

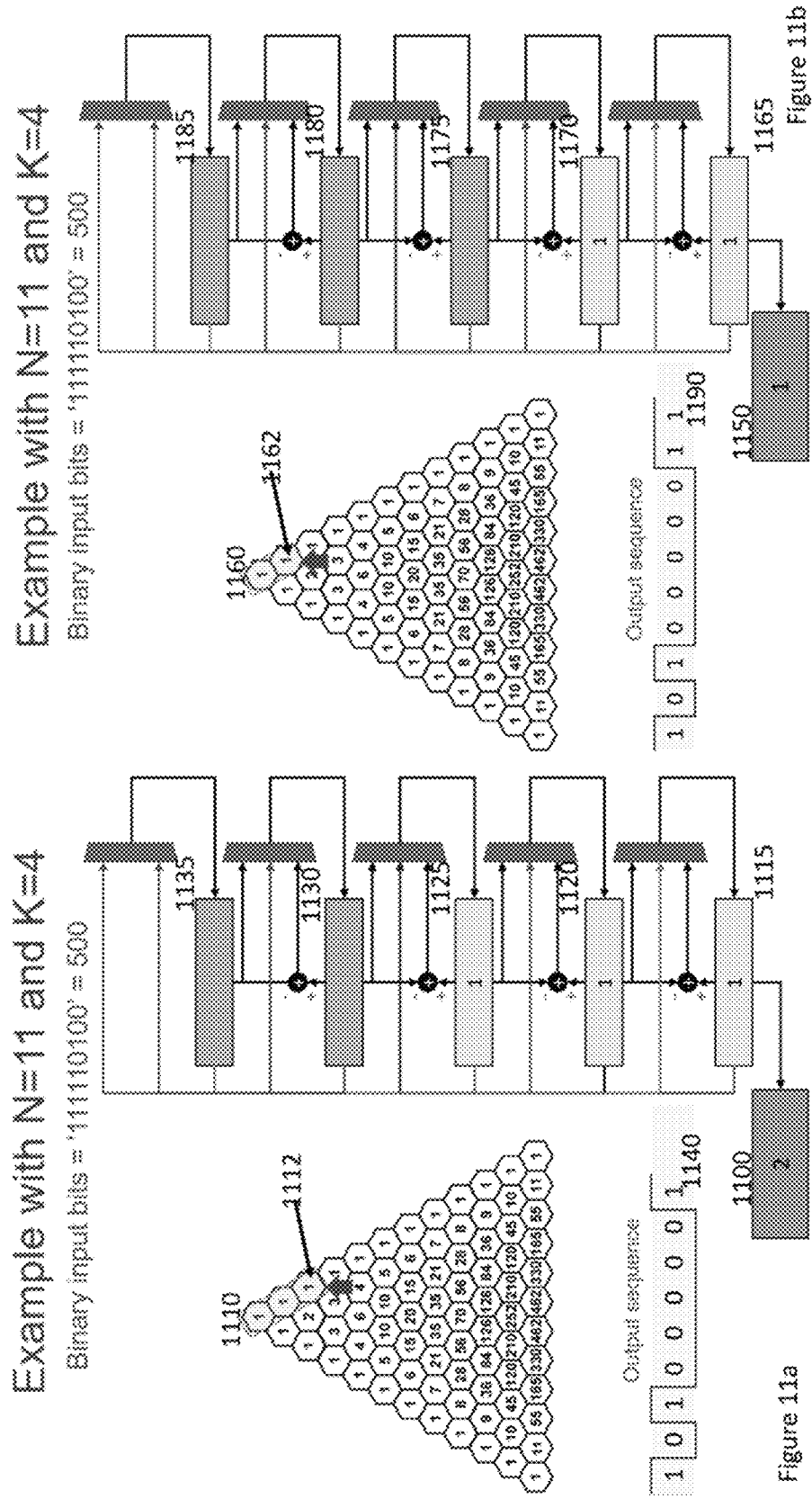

MPPM ENCODER AND DECODER

PRIORITY CLAIM AND CROSS-REFERENCE TO RELATED APPLICATION

This application claims the benefit of U.S. Provisional Patent Application Ser. No. 62/812,332 filed Mar. 1, 2019 entitled "Pascal's Triangle," which is incorporated herein by reference in its entirety for all purposes.

BACKGROUND

It may be beneficial to be able to transmit data optically.

BRIEF DESCRIPTION OF THE FIGURES

Various aspects and embodiments of the application will be described with reference to the following example embodiments. It should be appreciated that the figures are not necessarily drawn to scale.

FIG. 1 is a simplified illustration of a sample equation for an MPPM encoder, in accordance with an embodiment of the present disclosure;

FIG. 5A is an example of a second part of choosing a number of pulses to be transmitted, in accordance with an embodiment of the present disclosure;

FIG. 5B is an example of a second part of choosing a number of pulses to be transmitted, in accordance with an embodiment of the present disclosure;

FIG. 8A is an example of a third part of creating an output sequence for data to be transmitted, in accordance with an embodiment of the present disclosure;

FIG. 8B is an example of a fourth part of creating an output sequence for data to be transmitted, in accordance with an embodiment of the present disclosure;

FIG. 10A is an example of a seventh part of creating an output sequence for data to be transmitted, in accordance with an embodiment of the present disclosure;

FIG. 10B is an example of an eighth part of creating an output sequence for data to be transmitted, in accordance with an embodiment of the present disclosure;

FIG. 11A is an example of a ninth part of creating an output sequence for data to be transmitted, in accordance with an embodiment of the present disclosure;

FIG. 11B is an example of a tenth part of creating an output sequence for data to be transmitted, in accordance with an embodiment of the present disclosure.

SUMMARY

Figure 2:
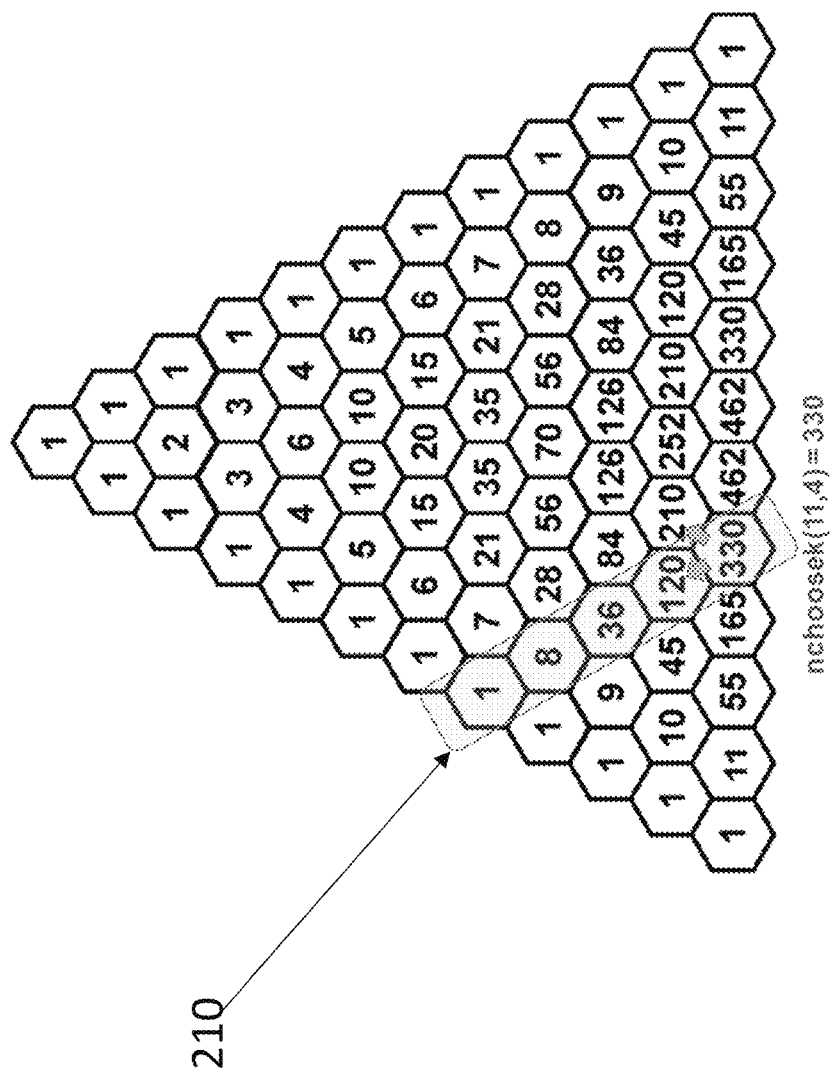
FIG. 2 is a simplified illustration of Pascal's Triangle, with a diagonal of the triangle highlighted for use with an MPPM encoder, in accordance with an embodiment of the present disclosure.

A method, system, and apparatus for calculating coefficients for inputs and corresponding output sequences for a pulse-position modulation encoder using a stored structure; wherein the structure contains a subset of the coefficients.

DETAILED DESCRIPTION

Generally, coherent data transmission encodes data on a carrier signal. Usually, that carrier signal is modulated according to a specific format. Typically, a modulation format is described by an underlying constellation, which defines signal points in two dimensional space that are used to encode data. Conventional QAM systems use signal points with equal probabilities. Generally, for a conventional QAM constellation, input distribution is uniform and the transmitted QAM sequence has a histogram that looks like a cube.

In many embodiments, Applicants have realized that a bell-shaped Gaussian distribution may have a better power efficiency and may be optimal compared to typical QAM modulation formats, such as those that use points with equal probabilities. Conventionally, probabilistic constellation shaping (PCS) is a modulation format that may be an enabling technology for power-efficient and data rate flexible fiber-optic communication. In certain embodiments, Applicants have realized that PCS may be used to imitate a Gaussian distribution on signal points and may use signal points with lower power more frequently. In some embodiments, a Gaussian type distribution of signal points may be realized by generating a non-uniform distribution using a distribution matching (DM) algorithm. In certain embodiments, Applicants have realized that there may be a tradeoff with an implementation complexity of DM algorithms where algorithms that are more complex require more processing power perform better while less complex implementations tend to not perform as well but require less power. In other embodiments, Applicants have realized that recording all of a distribution mapping in memory may require large amounts of storage.

In some embodiments, pulse-position modulation (PPM) may be a form of signal modulation in which blocks of n time slots contains one "1" and n–1 "0's." In certain embodiments, information may be encoded by letting each group of $\log_2\{n\}$ bits designate which of then slots contains the "1." In many embodiments, multipulse PPM (MPPM) may extend PPM by allowing more than one pulse per block. In some embodiments, in n-slot k-pulse MPPM, there may be nchoosek(n, k) unique symbols, corresponding to the possible ways to populate n slots with k pulses. In many embodiments, an additional generalization may be possible by not having a fixed number of pulses per block, but a maximum number of pulses $k_{min} \leq k \leq k_{max}$, which may be referred to herein as Flex-MPPM. In most embodiments, Flex-MPPM modulation may increase a number of bits that can be encoded within each block while at the same time reducing the average number of pulses per block.

In some embodiments, an encoder, such as an (M)PPM encoder, may use a look-up table (LUT) to map incoming bits to the corresponding pulse positions or constellation positions. In most embodiments, a LUT may be used by an encoder to generate points in a constellation that correspond to a Gaussian distribution or another distribution that does not have equal probabilities assigned to each constellation point. In many embodiments, this may be a straightforward and simple implementation for short block lengths or lower order constellations, but the size of a LUT may increase exponentially with the number of bits transmitted in each block.

In certain embodiments, for example (8,1)MPPM may encode 3 bits in one block and needs an 8×8-bit=64-bit LUT. In some embodiments, (16,3)MPPM may encode 9 bits in one block, which requires a 512×16-bit=8-kbit LUT. In other embodiments, Flex-(32,7)MPPM may encode 22 bits in one block, and the size increases to a 4,194,304×32-bit=128-Mbit LUT. In some embodiments, a LUT implementation may quickly become unfeasible for large block sizes and/or a large number of pulses in a MPPM block.

In many embodiments, the current disclosure realizes that a LUT for large block or constellation sizes and/or a large number of pulses may take up too much space on processor, digital signal processor, or other memory structure. In most embodiments, the current disclosure realizes that enabling a calculation of a LUT using limited processing power may be beneficial over storing a large LUT. In some embodiments, the current disclosure has realized that calculating each value in a LUT may also not be power efficient. In other embodiments, the current disclosure has realized it may be beneficial to store a portion of a LUT and to calculate a portion of a LUT. In many embodiments, efficient calculation of a LUT may use a portion of a Pascal's Triangle and processing for non-stored values. In most embodiments, Pascal's Triangle may have similarities such that storing a portion of the triangle may enable quick and efficient calculation of the rest of the triangle.

In some embodiments, instead of storing possible pulse positions in a large memory, an encoder, such as an MPPM encoder, may exploit a recurrence relation of binomial coefficients to enable quick determination of the values of a LUT without having to store every value of the LUT. In certain embodiments, a recurrence relation may enable efficient calculation of required coefficient for possible inputs and corresponding output sequences, when such value is not stored in a redacted portion of a LUT.

Refer now to the example embodiment of FIG. 1, which illustrates a sample equation for an MPPM encoder. In this embodiment, the number of possible combinations in a (n,k)MPPM block 110 is equal to the number of remaining possible combinations if a first slot contains no pulse 120 plus the number of remaining combinations if the first slot contains a pulse 130.

In many embodiments, by using a recurrence relation an encoder may step through a block, slot by slot, and determine whether the slot contains a pulse. In certain embodiments, storage or memory required may be to store k+1 initial binomial coefficients, where k is the number of pulses. In most embodiments, an encoder may consider $$m = \left\lfloor \log_2 \left\{ \binom{n}{k} \right\} \right\rfloor$$

input bits as an unsigned integer U=0 . . . $2^m-1$.

In some embodiments, an encoder may check in each slot if U is larger than the number of remaining possible combinations when no pulse is sent. In most embodiments, if U is larger than a number of remaining combinations, an encoder may send a pulse and subtracts that number from U. In most embodiments, if U is not larger than a number of remaining combinations, an encoder may not send a pulse. In almost all embodiments, a recurrence relation may be used to calculate a binomial coefficient for a next iteration. In some embodiments, an encoder may move on to a next slot with an updated U.

A particular embodiment of an encoding process is exemplified by the following pseudo-code:

| Example embodiment Pseudo-Code for encoding | Comments |
|---|---|
| nchsk_vec[0:k] = [nchoosek(n-k-1,0), ... nchoosek(n-k,1), ..., nchoosek(n-1,k)]<br>For i in 0 to n-1<br>  If U >= nchsk_vec[k]<br>    U -= nchsk_vec[k]<br>    nchsk_vec[1:k] = nchsk_vec[0:k-1]<br>    x[i] = 1<br>  else<br>    nchsk_vec[1:k] -= nchsk_vec[0:k-1]<br>    x(i) = 0 | k is the number of pulses<br>n is the block length<br>U is the transmitted word (data)<br>In some embodiments, these values may be stored and may not need to be recalculated for every block. In alternative embodiments, k may be decremented.by 1. |

In some embodiments, a content of nchsk_vec[0:k] may be illustrated by "Pascal's Triangle," a triangular array of the binomial coefficients, where nchsk_vec[0:k] may be a combination of stored and calculated values as shown in the pseudo-code above. Refer now to the example embodiment of FIG. 2 for an example embodiment of Pascal's Triangle.

In certain embodiments, a vector or set of values may be initialized with a diagonal of Pascal's Triangle based on parameters n, k from a (n,k)MPPM. In many embodiments, in each encoding iteration a vector may be either shifted one row up to the left (in case a pulse is sent), or one row up to the right (in case no pulse is sent). Referring back to the example embodiment of FIG. 2, the shaded row illustrates initial values for (12,4)MPPM. In the example embodiment of FIG. 2, the number of pulses is fixed, so the diagonal of Pascal's Triangle may be stored for this particular k.

In other embodiments, if there is not a fixed number of pulses, i.e. the number of pulses can vary, a row of Pascal's Triangle may be stored, and a diagonal of Pascal's Triangle may be calculated by the number of pulses to be encoded. In many embodiments, the number of values in a row of Pascal's Triangle to be stored may be equivalent to the max number of pulses that can be transmitted plus 1. In certain embodiments, an encoder may need to have two sets of registers, a first set to determine computing pulse positions of a first block and a second set of registers to compute the number of pulses in the next block. In many embodiments, if a portion of a row of Pascal's Triangle is stored, it may be used to create a diagonal portion of Pascal's Triangle. In certain embodiments, during processing, a portion of a row of Pascal's Triangle may be stored and a portion of a diagonal of Pascal's Triangle may be stored. In many embodiments, portions of Pascal's Triangle may be stored in memory. In other embodiments, portions of Pascal's Triangle may be stored in a structure. In many embodiments, during processing one or more portions of diagonals of Pascal's Triangle may be calculated.

In some embodiments, a number of bits that may be encoded in one Flex-MPPM block may be given by the equation:

$$m = \left\lfloor \log_2 \left\{ \sum_{k=k_{min}}^{k_{max}} \binom{n}{k} \right\} \right\rfloor$$

In many embodiments, to use Flex-MPPM modulation, incoming data may need to be preprocessed in order to select how many pulses k may be used for encoding. The following pseudo-code provides an example embodiment of a process:

| Example embodiment Pseudo-Code for selecting a portion of Pascal's Triangle | Comments |
| --- | --- |
| k = $k_{max}$<br>for i in $k_{min}$ to $k_{max}$–1<br>  if U >= nchoosek(n,i)<br>    U –= nchoosek(n,i)<br>  else<br>    k = i<br>    break | In certain embodiments, a required nchoosek( ) values may be stored in a LUT. |

In many embodiments, final values for U and k may be passed to an MPPM encoder.

In some embodiments, an MPPM decoder may reverse an encoding process to recover original bits sent into an encoder. In many embodiments, by using recurrence relation of binomial coefficients in the same way as an encoder, a very efficient decoding algorithm may be implemented:

| Example embodiment of Pseudo-Code | Comments |
| --- | --- |
| nchsk_vec[0:k] = [nchoosek(n-k,0), ... nchoosek(n-k,1), ..., nchoosek(n-1,k)]<br>U = 0<br>For i in 0 to n–1<br>  if x(i) == 1<br>    U += nchsk_vec[k]<br>    nchsk_vec[1:k] = nchsk_vec[0:k–1]<br>  else<br>    nchsk_vec[1:k] –= nchsk_vec[0:k–1] | In some embodiments, values may be stored and may not need to be recalculated for every block.<br>In alternative embodiments, k may be decremented by 1. |

In certain embodiments, there may be two options to implement a Flex-MPPM decoder. In a first embodiment, a parallel implementation of multiple standard MPPM decoders may be used. In a second embodiment, processing of a received block may be reversed. In certain embodiments, processing of a received block may require additional memory to store the block, because a decoder may need to wait for the full block to be received before it can start the decoding process, but it may allow implementation of decoding with a single decoder.

In some embodiments, Flex-MPPM may be decoded by using $k_{max}$-$k_{min}$+1 parallel decoders, i.e. one for each number of pulses that are possible. In some embodiments, a difference to a standard MPPM decoder may be that $U_k$ is initialized differently in each decoder:

$$U_k = \sum_{i=k_{min}}^{k-1} \binom{n}{i} \; k \in [k_{min}, k_{max}]$$

In most embodiments, after decoders finished their decoding process, the output of the decoder may be chosen that corresponds to the number of actually received pulses.

In some embodiments, to avoid parallel implementations of multiple decoders, reverse processing of a received block may be used with a single decoder. The following pseudo-code provides an example embodiment of a decoding process:

| Example embodiment of Pseudo-Code | Comments |
| --- | --- |
| nchsk_vec[0:$k_{max}$–1] = [0, 0, ..., 0]<br>U = 0<br>k = 0<br>For i in n–1 downto 0<br>  if x(i) == 1<br>    U += nchsk_vec[k]<br>    k += 1<br>    if k >= $k_{min}$<br>      U += nchoosek(n, k–1)<br>    nchsk_vec[0:$k_{max}$–1] += [1, nchsk_vec[0:$k_{max}$–1]] | In some embodiments, a required nchoosek( ) values may be stored in a LUT. |

Figure 3:
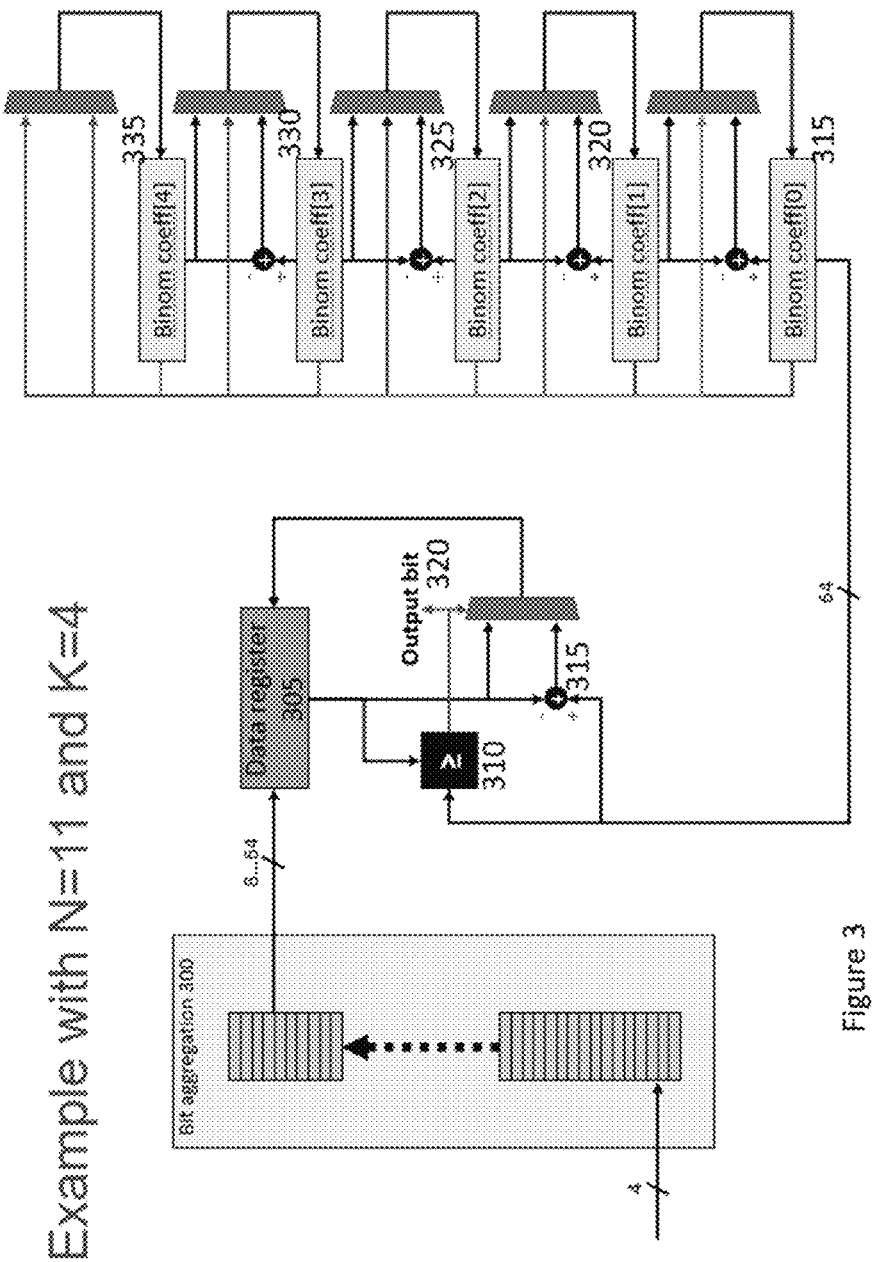
FIG. 3 is an example of an encoding apparatus for encoding data, in accordance with an embodiment of the present disclosure.

Refer now to the example embodiment of FIG. 3, which illustrates a sample encoder implementation. In the example embodiment of FIG. 3, there is bit aggregation 300, data register 305, comparator 310, adder/subtractor 315, output bit 320, binom coeff[0] 325, binom coeff[1] 330, binom coeff[2] 335, binom coeff[3] 340, and binom coeff[4] 345. Binom coeff[0-4] correspond to binary coefficients that are populated with data from portions of Pascal's Triangle. Comparator 310 may be used to compare two values. Adder/subtractor 315 can be used to add or subtract two numbers.

Figure 4:
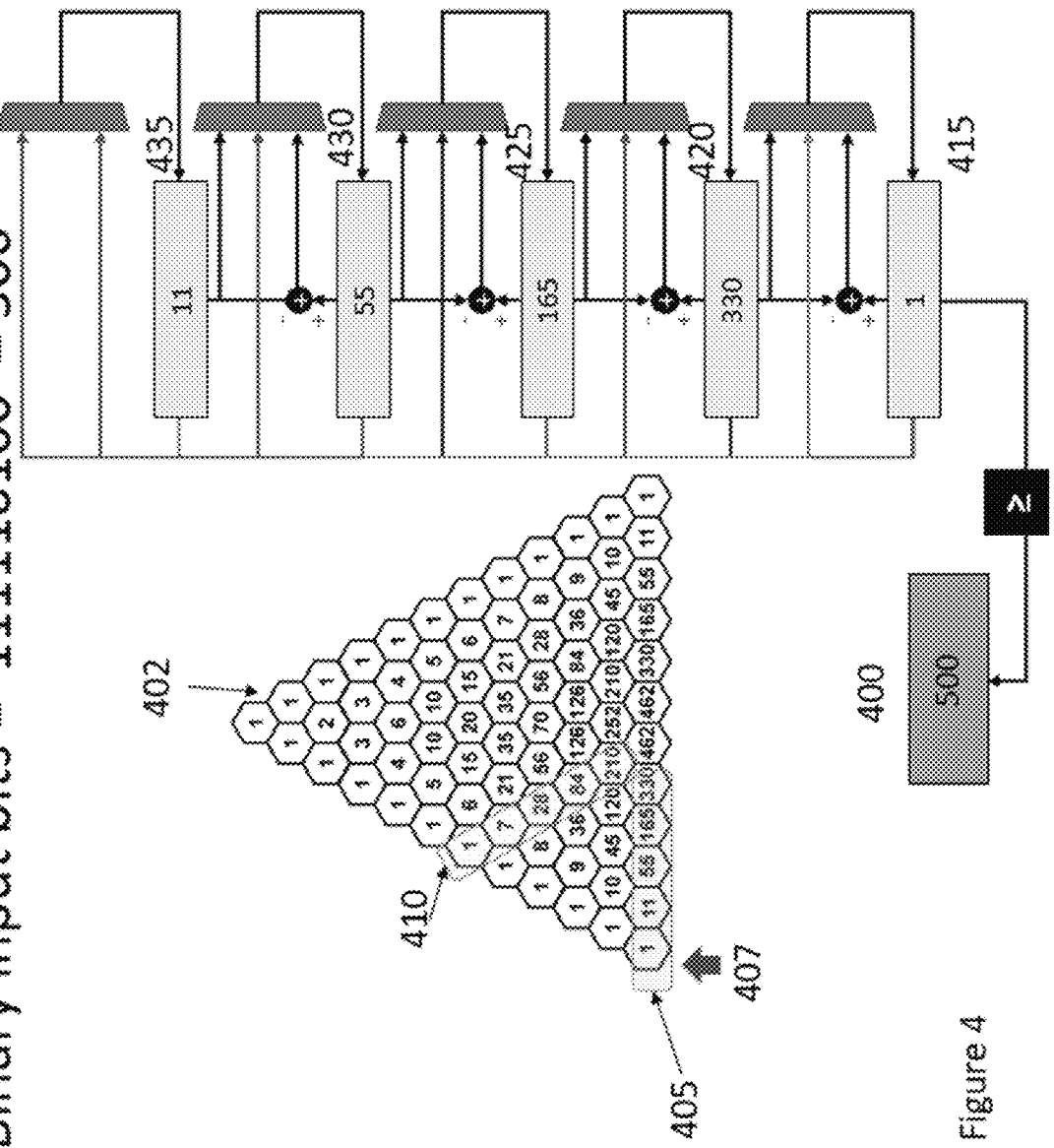
FIG. 4 is an example of a first part of choosing a number of pulses to be transmitted, in accordance with an embodiment of the present disclosure.

Refer now to the example embodiment of FIG. 4, which illustrates a first step in determining a portion of Pascal's Triangle to be used for data encoding. Box 400 contains a value of data to be encoded and has a value of 500. Pascal's Triangle 402 is shown for clarity, but does not exist in memory of an encoder. Rather, the shaded portion of row 405 exists within memory. Shaded portion 405 represents a row of Pascal's Triangle that include k+1 values. Row marker 407 is set to the first value in Row 405. Register 415 is populated with the first value of shaded portion 405 and register 435 has the second value, register 430 has the third value, register 425 has the fourth value, and register 420 has the fifth value. Shaded area 410 represents the values the algorithm will calculate as the portion of Pascal's Triangle to be used to encode data. A comparison is made to see if the value in register 415 is greater than that of the data value in box 400, which it is not.

Refer now as well to the example embodiment of FIG. 5A. Box 500 has had the value 1 subtracted from it and now contains the value 499. Shaded diagonal 510 has been calculated. Row marker 505 has been advanced to the second value of row 502. The value of registers 520 and 515 have been replaced with the values of the diagonal indicated by shaded portion 510 which contains the values 1 and 11. Register 515 contains the value 11, which is the second value in row 502. A comparison is made to determine whether the value in box 500 is greater than 11 in box 515, which it is not.

Refer now as well to the example embodiment of FIG. 5B. The value of 11 from register 515 of FIG. 5A has been subtracted from box 500 of FIG. 5A, and the result 488 has been placed in box 550. The shaded diagonal 560 has been calculated to now contain 3 values 1, 10, and 55, and the placement of row marker 555 has been advanced to the third position in the row 552. Calculation of shaded region 560 is based on the stored information in row 552 and a mathematical calculation to get the value 10. Register 575 has the first value of diagonal 560, register 570 has the second value of diagonal 560, and register 565 has the value of the third value of diagonal 560, which is 55. A comparison is made to determine of the value of register 565, 55, is greater than the value in box 550, 488, which it is not.

Figure 6A:
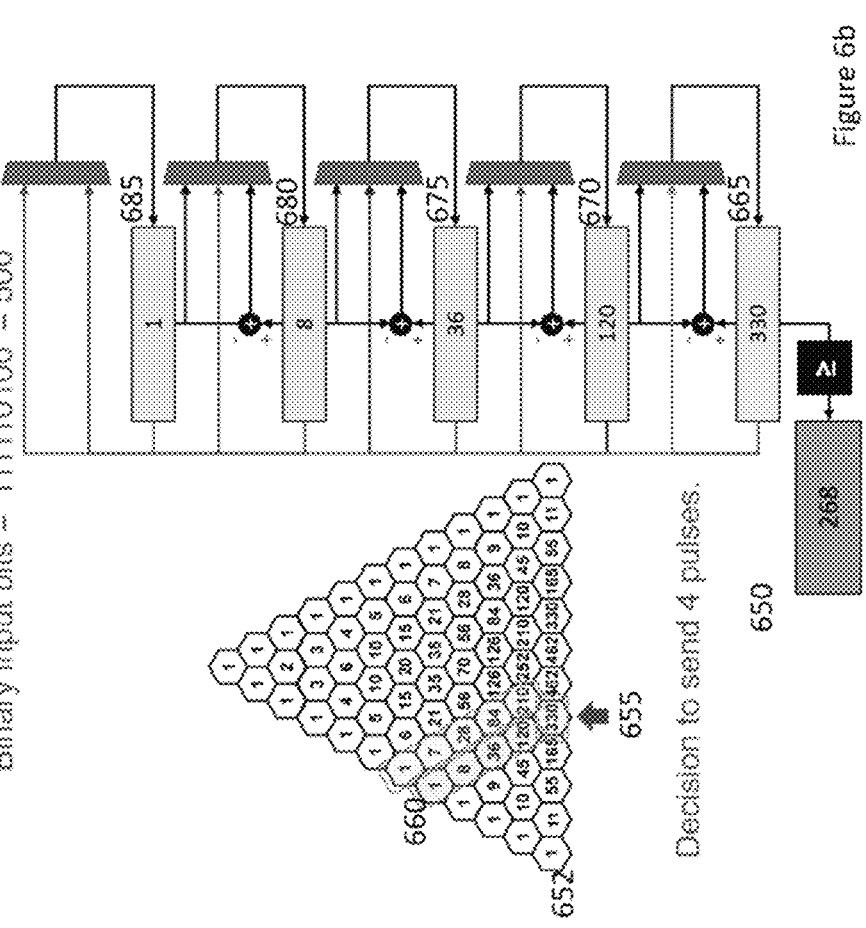
FIG. 6A is an example of a third part of choosing a number of pulses to be transmitted, in accordance with an embodiment of the present disclosure.

Refer now as well to the example embodiment of FIG. 6A. In the example embodiment of FIG. 6A, the value of box 600 has had 55 subtracted from it, resulting in the value being 433. Row marker 605 has been advanced to the fourth value in row 602. Values for shaded diagonal 610 have been calculated using the value in row marker 605 and the values in the previous shaded diagonal, 560 from FIG. 5B. Registers 630, 625, 620, and 615 have been updated with the values from shaded diagonal 610. A comparison is made to see if the value in register 615 is greater than the value in box 600, which it is not.

Figure 6B:
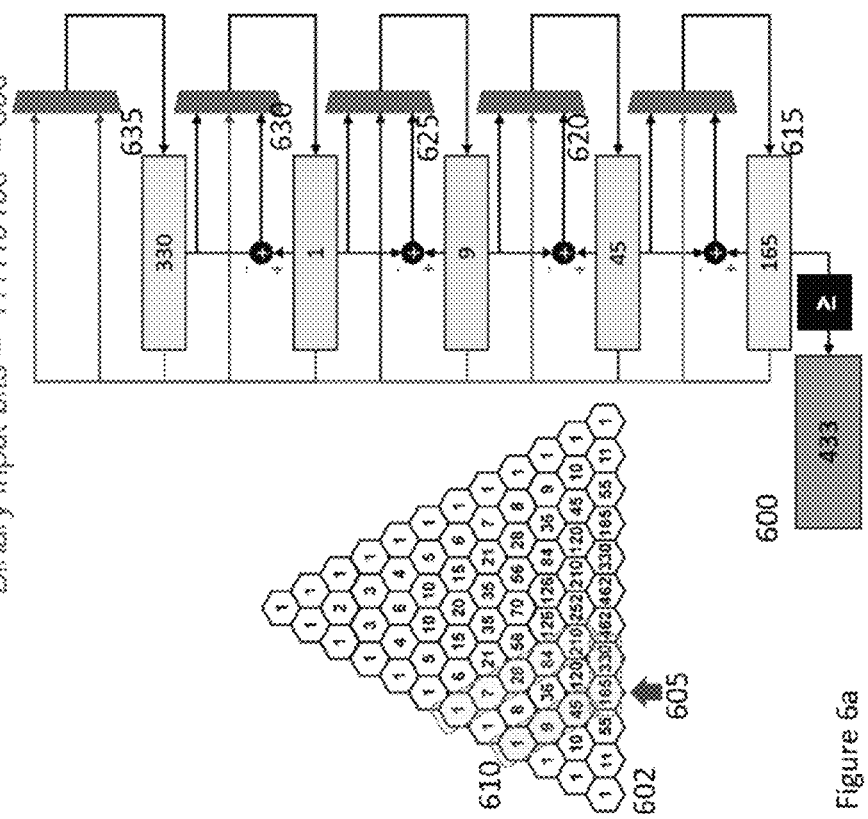
FIG. 6B is an example of a fourth part of choosing a number of pulses to be transmitted, in accordance with an embodiment of the present disclosure.

Refer now as well to the example embodiment of FIG. 6B. The value in box 650 has been updated to correspond to the value of box 600 of FIG. 6A, with value 433, less the value of register 615 of FIG. 6A, to be a value of 268. Row marker 655 is set to be the fifth value in row 652. Values for shaded diagonal 660 are calculated based on the values in previous shaded row 610 and the value of row marker 655. Values of registers 665, 670, 675, 680, and 685 are updated based on the values of shaded diagonal 660. A comparison is made to determine whether the value in register 665 is greater than the value in box 650, which it is.

Figure 7A:
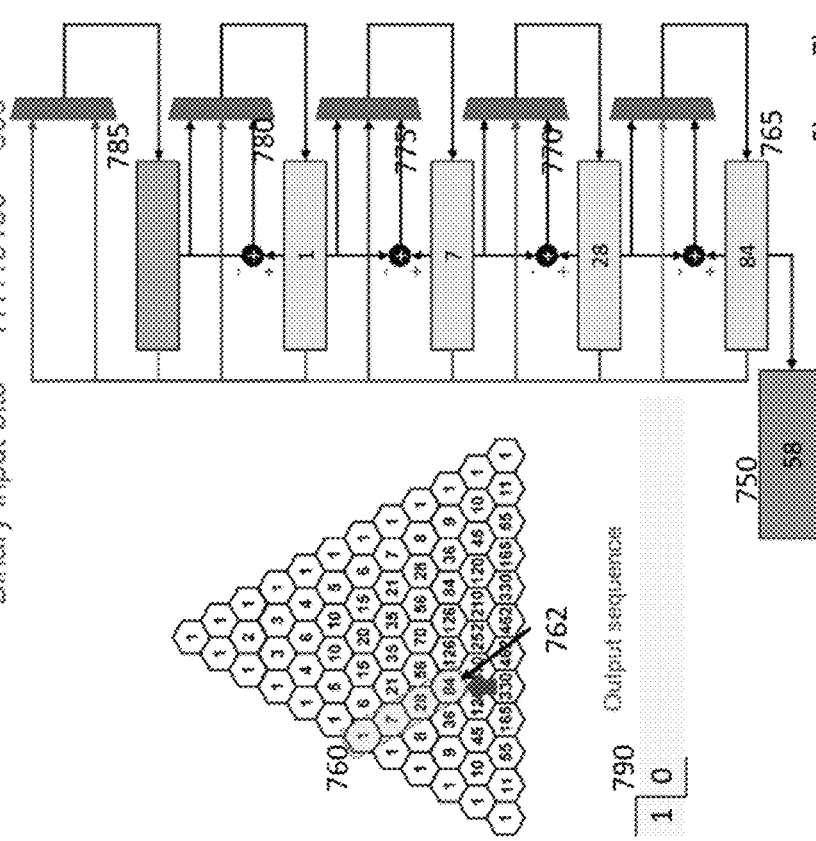
FIG. 7A is an example of a first part of creating an output sequence for data to be transmitted, in accordance with an embodiment of the present disclosure.

Refer now as well to the example embodiment of FIG. 7A. As the comparison between the value in register 665 in FIG. 6B was greater than the value in box 650 in FIG. 6B, shaded diagonal region 710 is calculated based on the value of shaded row 660 of FIG. 6B. The values of diagonal 710 are the coefficients that are used to encode the output sequence for the input data. Registers 715, 720, 725, 730, and 735 are filled with the values of shaded diagonal row 710. Value marker 712 is placed at value 210 in shaded diagonal region 710. A determination is made if the value in register 715 is less than the value in box 700. Since the value of box 700 is greater than the value in register 715, an output sequence of 1 is encoded and the value in register 715 is subtracted from the value in box 700.

Figure 7B:
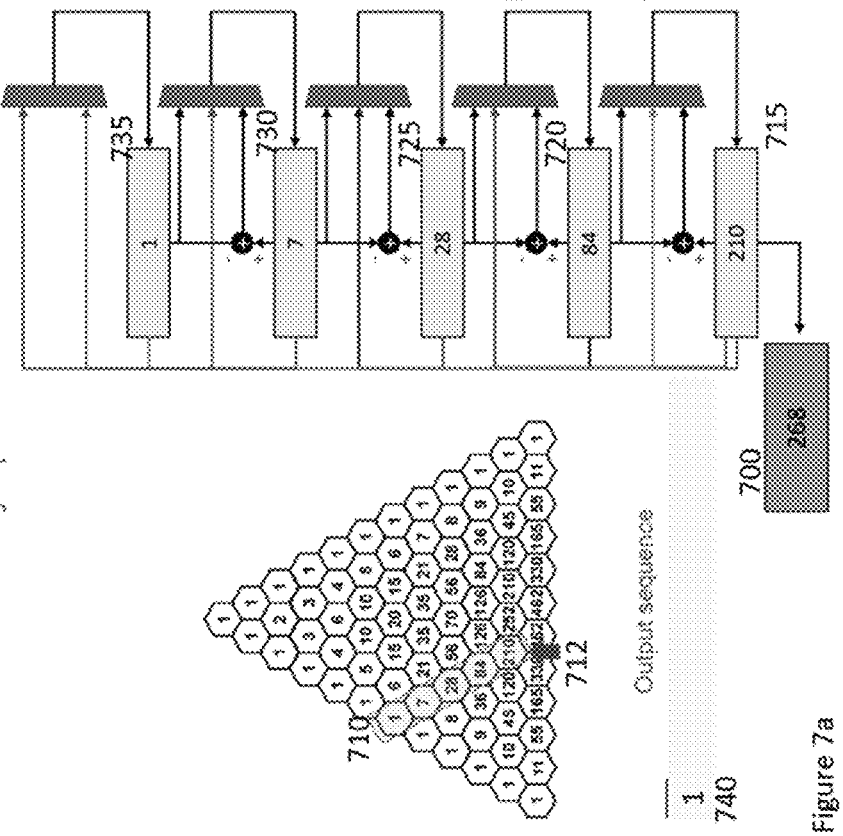
FIG. 7B is an example of a second part of creating an output sequence for data to be transmitted, in accordance with an embodiment of the present disclosure.

Refer now as well to the example embodiment of FIG. 7B, which illustrates encoding of a second output bit. Value marker 762 is advanced to point to the next value in shaded diagonal row 760. The values in registers 765, 770, 775, 780, and 785 are updated with the values of shaded diagonal 760 as illustrated. The value in box 750, 58, is compared to the value in register 765, 84, which corresponds to the value indicated by value marker 762. The value in register 765, 84, is greater than the value in box 750, so a zero is encoded in the output sequence. Refer now as well to the example embodiment of FIG. 8A. As the value in register 765 of FIG. 7B was greater than the value in box 750 of FIG. 7B, a new shaded diagonal is calculated as shaded diagonal 810 and value marker 812 is set to be 56. The values in registers 830, 825, 820, and 815 are updated. A comparison is made to determine if the value in register 815, 56 is less than the value in box 800, 58. As the value in register 815 is less than the value in box 800, a 1 840 is encoded in the output sequence and the value in register 815 is subtracted from the value in box 800.

Refer as well to the example embodiment of FIG. 8B. Value marker 862 is advanced to the next value in shaded diagonal 860, which is 21. The values in register 875, 870, and 865 are updated. A comparison is made to see if the value in register 865, 21, is greater than the value in box 850, 2. It is not, so a zero 890 is encoded in output sequence.

Figures 9A, 9B:
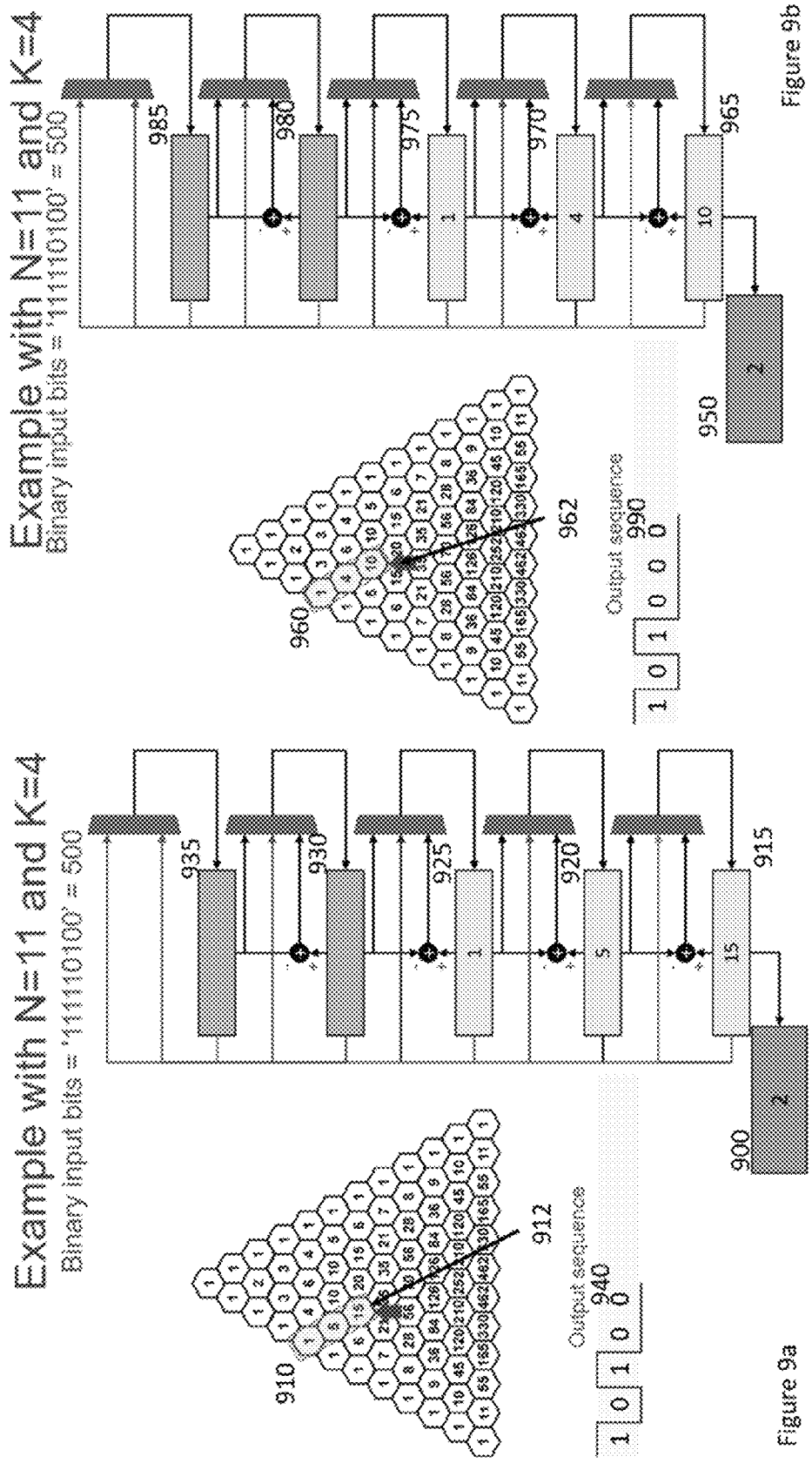
FIG. 9A is an example of a fifth part of creating an output sequence for data to be transmitted, in accordance with an embodiment of the present disclosure.
FIG. 9B is an example of a sixth part of creating an output sequence for data to be transmitted, in accordance with an embodiment of the present disclosure.

Refer now as well to the example embodiment of FIG. 9A. As the value in register 865 of FIG. 8B was greater than the value in box 850 of FIG. 8B, new shaded diagonal 910 is calculated. Value marker 912 is set to be the last value of shaded diagonal 910, which is 15. Registers 925, 920, and 915 are updated with the values from shaded diagonal 910. A comparison is made to determine if the value in box 900, 2, is larger than the value in register 915, 15, which it is not.

Refer now as well to the example embodiment of FIG. 9B. As the value in register 915 of FIG. 9A was greater than the value in box 900 of FIG. 9A, new shaded diagonal 960 is calculated. The values in registers 965, 970, and 975 are updated with the values in shaded diagonal 960. A comparison is made to determine if the value in box 950, 2, is greater than the value in register 965, 10, which it is not, so a zero 990 is encoded in the output sequence.

Refer now as well to the example embodiment of FIG. 10A. In the example embodiment of FIG. 10A, new shaded diagonal 1010 has been calculated as a zero was encoded at the last comparison (FIG. 9B). Value marker 1012 is set to the third value in shaded diagonal 1010. Registers 1015, 1020, and 1025 are updated with the values of shaded diagonal 1010. A comparison is made to see if the value in box 1000, 2, is larger than the value in register 1015, 6. The value is not larger, so zero 1040 is encoded in the output sequence.

Refer now as well to the example embodiment of FIG. 10B. In the example embodiment of FIG. 10B, new shaded diagonal 1060 has been calculated as a zero was encoded at the last comparison (FIG. 10A). Value marker 1062 is set to the third value in shaded diagonal 1060. Registers 1065, 1070, and 1075 are updated with the values of shaded diagonal 1060. A comparison is made to see if the value in box 1050, 2, is larger than the value in register 1065, 3. The value is not larger, so zero 1090 is encoded in the output sequence.

Refer now as well to the example embodiment of FIG. 11A. In the example embodiment of FIG. 11A, new shaded diagonal 1110 has been calculated as a zero was encoded at the last comparison. Value marker 1112 is set to the third value in shaded diagonal 1110. Registers 1115, 1120, and 1125 are updated with the values of shaded diagonal 1110. A comparison is made to see if the value in box 1100, 2, is larger than the value in register 1115, 1. The value is larger so one 1140 is encoded in the output sequence.

Refer now as well to the example embodiment of FIG. 11B. In the example embodiment of FIG. 11B, Value marker 1162 is advanced to the second value in shaded diagonal 1160 as a 1 was encoded. Registers 1165 and 1170 are incremented. A comparison is made to see if the value in box 1150, 1, is larger or equal to than the value in register 1165, 1. The value is equal to the value so one 1190 is encoded in output sequence.

Figure 12:
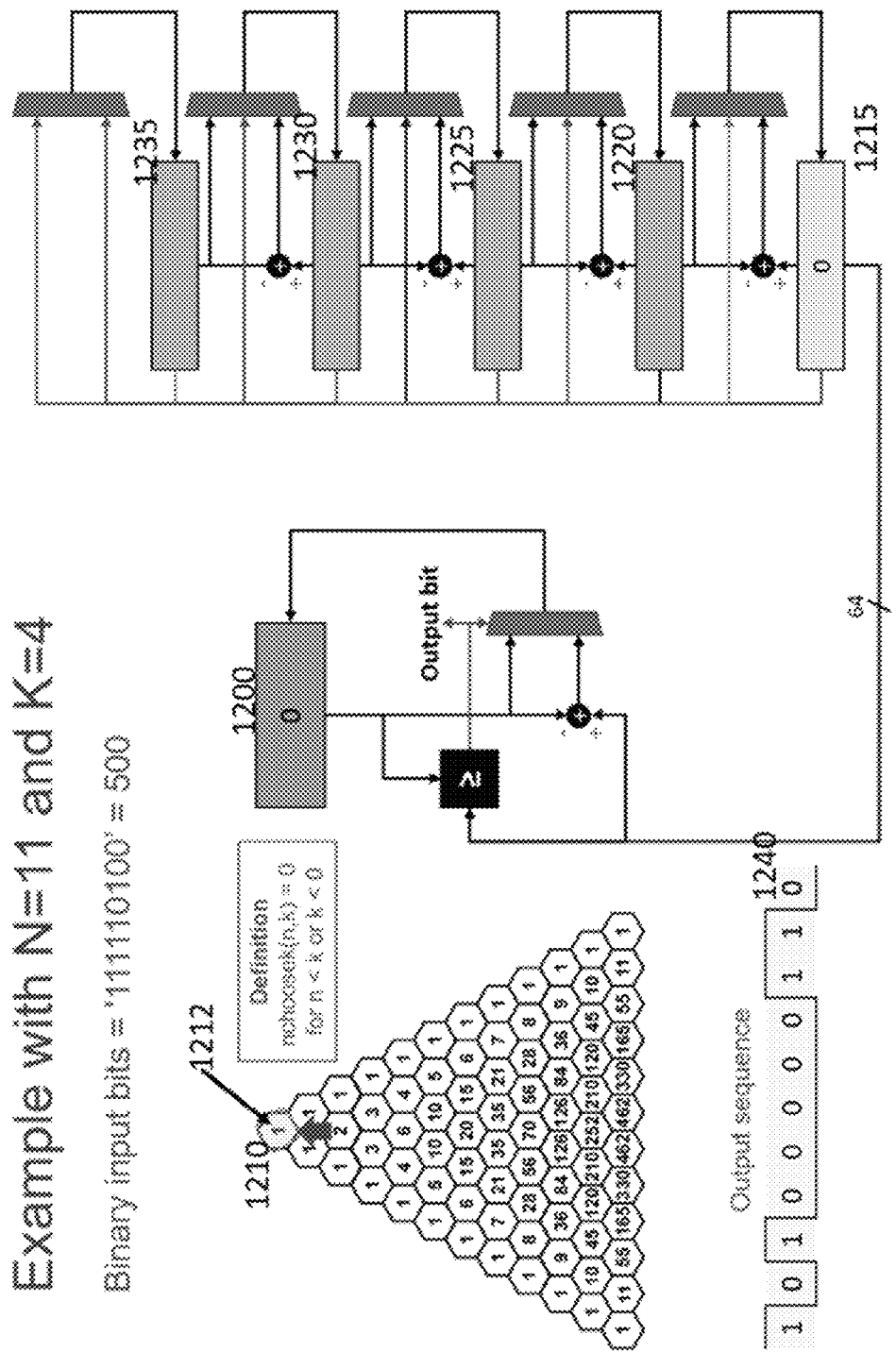
FIG. 12 is an example of an eleventh part of creating an output sequence for data to be transmitted, in accordance with an embodiment of the present disclosure.

Refer now as well to the example embodiment of FIG. 12. In the example embodiment of FIG. 12, Value marker 1212 is advanced to the first value in shaded diagonal 1210 as a 1 was encoded. Register 1215 is incremented. A comparison is made to see if the value in box 1200, 0, is larger or equal to than the value in register 1215, 0. In this case, both values are 0, so zero 1240 is encoded in the output sequence. The final encoded output sequence is 10100000110.

In many embodiments, one or more of the current techniques may be performed in a Digital Signal Processing (DSP) of a receiver. In some embodiments, a DSP may encode a particular constellation. In most embodiments, one or more of the current techniques may be performed in real time.

In some embodiments, one or more of the embodiments described herein may be stored on a computer readable medium. In certain embodiments, a computer readable medium may be one or more memories, one or more hard drives, one or more flash drives, one or more compact disk drives, or any other type of computer readable medium. In certain embodiments, one or more of the embodiments described herein may be embodied in a computer program product that may enable a processor to execute the embodiments. In many embodiments, one or more of the embodiments described herein may be executed on at least a portion of a processor. In most embodiments, a processor may be a physical or virtual processor. In other embodiments, a virtual processor may be spread across one or more portions of one or more physical processors. In certain embodiments, one or more of the embodiments described herein may be embodied in hardware such as a Digital Signal Processor DSP. In certain embodiments, one or more of the embodiments herein may be executed on a DSP. One or more of the embodiments herein may be programed into a DSP. In some embodiments, a DSP may have one or more processors and one or more memories. In certain embodiments, a DSP may have one or more computer readable storages. In some embodiments, on or more of an encoder, decoder, mapper, modulator, demodulator, decoder, and demapper may be part of one or more DSPs. In other embodiments, one or more of the embodiments stored on a computer readable medium may be loaded into a processor and executed. In further embodiments, on or more of the techniques herein may be performed by an ASIC chip. In certain embodiments, a DSP may be an ASIC chip.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. A method comprising:
calculating coefficients for inputs and corresponding output sequences for a pulse-position modulation encoder using a stored structure; wherein the structure contains a subset of Pascal's Triangle; wherein the pulse-position modulation encoder is a flex multipulse-position modulation encoder and the structure includes a portion of a row of Pascal's Triangle.

2. The method of claim 1 wherein the pulse-position modulation encoder is an MPPM encoder and the stored structure includes a diagonal of a Pascal's Triangle.

3. The method of claim 2 wherein at least a portion of the stored portion of Pascal's Triangle is used to calculate other portions of Pascal's Triangle.

4. The method of claim 1 wherein the number of values of the portion of a row is equal to a maximum number of possible encoded pulses plus 1.

5. The method of claim 4 wherein the portion of a row is used to calculate another portion of Pascal's Triangle, and the another portion of Pascal's Triangle is stored in memory.

6. A method comprising:
calculating coefficients for inputs and corresponding output sequences for a pulse-position modulation decoder using a stored structure, wherein the stored structure is a subset of the values in Pascal's Triangle; wherein the pulse-position modulation decoder is a flex multipulse-position modulation decoder and the stored structure includes a portion of a row of Pascal's Triangle.

7. The method of claim 6 wherein the pulse-position modulation decoder is a multipulse-position modulation decoder and wherein the stored structure includes a diagonal of a Pascal's Triangle.

8. The method of claim 7 wherein the used stored portion of Pascal's Triangle depends on a preprocessing block.

9. The method of claim 6 wherein the used stored portion of Pascal's Triangle depends on a preprocessing block.

10. The method of claim 6 wherein the portion of a row is used to calculate another portion of Pascal's Triangle, and the another portion of Pascal's Triangle is stored in memory.

11. A pulse-position modulation encoder, the encoder comprising:
memory; wherein the memory contains a structure corresponding to part of Pascal's Triangle; and
logic enabling the encoder to calculate coefficients for inputs and corresponding output sequences using the structure; wherein the pulse-position modulation encoder is a flex multipulse-position modulation encoder and the structure includes a portion of a row of Pascal's Triangle.

12. The encoder of claim 11 wherein the encoder is a multipulse-position modulation encoder and the stored structure includes a diagonal of a Pascal's Triangle.

13. The encoder of claim 12 wherein the stored portion of Pascal's Triangle is used to calculate other portions of Pascal's Triangle.

14. The encoder of claim 11 wherein the number of values of the portion of a row is equal to a maximum number of possible encoded pulses plus 1.

15. The encoder of claim 11 wherein the portion of a row is used to calculate another portion of Pascal's Triangle, and the another portion of Pascal's Triangle is stored in memory.

16. A decoder comprising:
memory; wherein the memory contains a structure corresponding to part of Pascal's Triangle; and
logic enabling the decoder to calculate coefficients for inputs and corresponding output sequences for a pulse-position modulation decoder using a stored structure, wherein the stored structure is a subset of the values in Pascal's Triangle; wherein the stored portion of Pascal's Triangle is used to calculate other portions of Pascal's Triangle.

17. The decoder of claim 16 wherein the pulse-position modulation decoder is a multipulse-position modulation decoder and wherein the stored structure is a diagonal of a Pascal's Triangle.

18. The decoder of claim 17 wherein the used stored portion of Pascal's Triangle depends on a preprocessing block.

19. The decoder of claim 16 wherein the pulse-position modulation decoder is a flex multipulse-position modulation decoder and the stored structure is a portion of a row of Pascal's Triangle.

20. The decoder of claim 16 wherein the stored structure comprises a diagonal of a Pascal's Triangle.

* * * * *